US009385017B2

(12) United States Patent
Fazio et al.

(10) Patent No.: US 9,385,017 B2
(45) Date of Patent: Jul. 5, 2016

(54) APPARATUS AND METHODS FOR HANDLING WORKPIECES OF DIFFERENT SIZES

(75) Inventors: James P. Fazio, San Mateo, CA (US); David K. Foote, San Jose, CA (US); James D. Getty, Vacaville, CA (US)

(73) Assignee: Nordson Corporation, Westlake, OH (US)

(*) Notice: Subject to any disclaimer, the term of this patent is extended or adjusted under 35 U.S.C. 154(b) by 65 days.

(21) Appl. No.: 13/567,507

(22) Filed: Aug. 6, 2012

(65) Prior Publication Data

US 2014/0034610 A1 Feb. 6, 2014

(51) Int. Cl.
*H01L 21/677* (2006.01)
*H01L 21/687* (2006.01)
*C23C 16/458* (2006.01)

(52) U.S. Cl.
CPC ........ *H01L 21/67742* (2013.01); *C23C 16/458* (2013.01); *C23C 16/4582* (2013.01); *C23C 16/4583* (2013.01); *C23C 16/4585* (2013.01); *H01L 21/67745* (2013.01); *H01L 21/67748* (2013.01); *H01L 21/67751* (2013.01); *H01L 21/68735* (2013.01); *H01L 21/68771* (2013.01)

(58) Field of Classification Search
CPC ............... H01L 21/68764; H01L 21/68785; H01L 21/265; H01L 21/302; H01L 21/3065; H01L 21/68; H01L 21/683; H01L 21/6719; H01L 21/67748; H01L 37/317; H01L 21/6732; H01L 21/67703–21/6776; H01L 21/6833; H01L 21/6835; H01L 21/68714–21/68792; H01L 21/68778; C23C 16/458; C23C 16/4582–16/4586; C23C 14/50; C30B 25/14; B05C 13/00; H01J 37/317; G03F 7/70691–7/70708; G03F 7/70716–7/70725; G11B 17/05–17/0515; G11B 17/053–17/056

USPC ........... 118/715, 728, 729; 156/345.1, 345.51
See application file for complete search history.

(56) References Cited

U.S. PATENT DOCUMENTS

| 5,569,350 | A | 10/1996 | Osada et al. |
| 5,823,416 | A | 10/1998 | Haji |
| 5,972,163 | A | 10/1999 | Haji |
| 6,093,904 | A | 7/2000 | Haji |
| 6,164,633 | A * | 12/2000 | Mulligan et al. ................ 269/21 |
| 6,440,178 | B2 | 8/2002 | Berner et al. |
| 6,700,089 | B1 | 3/2004 | Hirooka |
| 8,245,663 | B2 | 8/2012 | Fazio |
| 2002/0021435 | A1 | 2/2002 | Yamada |
| 2003/0020928 | A1 | 1/2003 | Ritzdorf et al. |

(Continued)

FOREIGN PATENT DOCUMENTS

| JP | 07033973 A | 2/1995 |
| JP | H07 033973 U * | 6/1995 |

OTHER PUBLICATIONS

International Searching Authority, International Search Report issued in corresponding PCT Application serial No. PCT/US2007/076205 dated Feb. 19, 2008.

(Continued)

*Primary Examiner* — Jeffrie R Lund
*Assistant Examiner* — Stanislav Antolin
(74) *Attorney, Agent, or Firm* — Baker & Hostetler LLP (57) ABSTRACT

Apparatus and methods for plasma processing workpieces of different diameters. The apparatus includes a lift plate having an outer perimeter, an opening inside of the outer perimeter, and a gap extending between the opening and the outer perimeter. The lift plate includes annular rims of different inner diameters and that are configured to respectively support the first and second workpieces.

10 Claims, 7 Drawing Sheets

(56) References Cited

U.S. PATENT DOCUMENTS

| | | | |
|---|---|---|---|
| 2003/0124820 A1* | 7/2003 | Johnsgard et al. | 118/715 |
| 2003/0183339 A1 | 10/2003 | Sasaoka et al. | |
| 2003/0232512 A1 | 12/2003 | Dickinson et al. | |
| 2005/0269031 A1* | 12/2005 | Tyler et al. | 156/345.48 |
| 2006/0011299 A1 | 1/2006 | Condrashoff et al. | |
| 2006/0090703 A1 | 5/2006 | Kaise et al. | |
| 2008/0296261 A1* | 12/2008 | Zhao et al. | 156/345.51 |
| 2009/0311088 A1* | 12/2009 | Fazio | 414/754 |

OTHER PUBLICATIONS

Japanese Patent Office, Office Action issued in related Japanese Patent Application No. 2009-525702 dated Jan. 23, 2012.

European Patent Office, Search Report and Written Opinion issued in International application No. PCT/US2013/053398 dated Oct. 29, 2013.

USPTO, Office Action issued in related U.S. Appl. No. 13/551,308 dated Nov. 2, 2012.

USPTO, Office Action issued in U.S. Appl. No. 13/551,308 dated Apr. 5, 2013.

The International Bureau of WIPO, International Preliminary Report on Patentability issued in International Application No. PCT/US2013/053398 dated Feb. 10, 2015.

USPTO, Notice of Allowance issued in U.S. Appl. No. 13/551,308 dated Nov. 20, 2014.

* cited by examiner

APPARATUS AND METHODS FOR HANDLING WORKPIECES OF DIFFERENT SIZES

TECHNICAL FIELD

The invention generally relates to apparatus and methods for workpiece handling and, more particularly, to apparatus and methods for transferring substrates of different sizes to and from an electrode of a plasma processing system.

BACKGROUND

Processing systems, such as plasma processing tools, rely on holding mechanisms to support a workpiece, such as a semiconductor, ceramic, or metal substrate or wafer, inside a process chamber during the performance of a treatment process. Certain holding mechanisms include lift pins configured to raise or lower in unison for elevating and lowering the workpiece relative to a top surface of a support. In the lowered position, the tips of the lift pins are either flush with, or slightly recessed below, the top surface of the support so that the workpiece at least partially contacts the top surface. In the raised position, the tips of the lift pins contact a bottom surface (backside) of the workpiece and elevate the workpiece above the top surface of the support. Typically, multiple lift pins establish multiple points of contact with the backside of the workpiece. The resulting gap between the lifted workpiece and the surface of the support permits an access space for insertion of an end effector.

The requirement for lift pins necessitates one or more mechanical feedthroughs in the process chamber for transferring mechanical motion from a location outside of the process chamber to the lift pins. Each mechanical feedthrough requires at least one port extending through the chamber wall of the process chamber. Each port provides a prime location for vacuum leaks. Moreover, contact between the lift pins and the workpiece may damage or contaminate the backside of the workpiece. Further, the process of elevating and lowering the lift pins may generate particles that contaminate the process chamber and, if not remediated, eventually, result in contamination of the processed workpieces.

It would therefore be desirable to provide improved processing methods and systems that eliminate the need for lift pins.

SUMMARY

In one embodiment, an apparatus is provided for use in the plasma processing of first and second workpieces of different diameters. The apparatus includes a lift plate having an outer perimeter, an opening inside of the outer perimeter, a first rim surrounding the opening, a second rim surrounding the opening, and a gap extending between the opening and the outer perimeter so that the first rim and the second rim are discontinuous. The first rim is configured to support the first workpiece. The second rim is configured to support the second workpiece. The first rim has an inner diameter that is greater than an inner diameter of the first rim.

In yet another embodiment, a method is provided for processing a first workpiece and a second workpiece of different diameters in a process chamber. The method includes supporting the first workpiece at an outer peripheral edge on a lift plate at a first rim having an inner diameter and moving the lift plate toward a pedestal portion of a lower electrode so as to transfer the first workpiece from the lift plate to the pedestal portion. The method also includes processing the first workpiece with plasma while the first workpiece is supported on the pedestal portion. The method includes removing the first workpiece from the lift plate. The method further includes supporting the second workpiece at an outer peripheral edge on a lift plate at a second rim having an inner diameter that is larger than the inner diameter of the first rim.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the embodiments of the invention.

DETAILED DESCRIPTION

Figure 1:
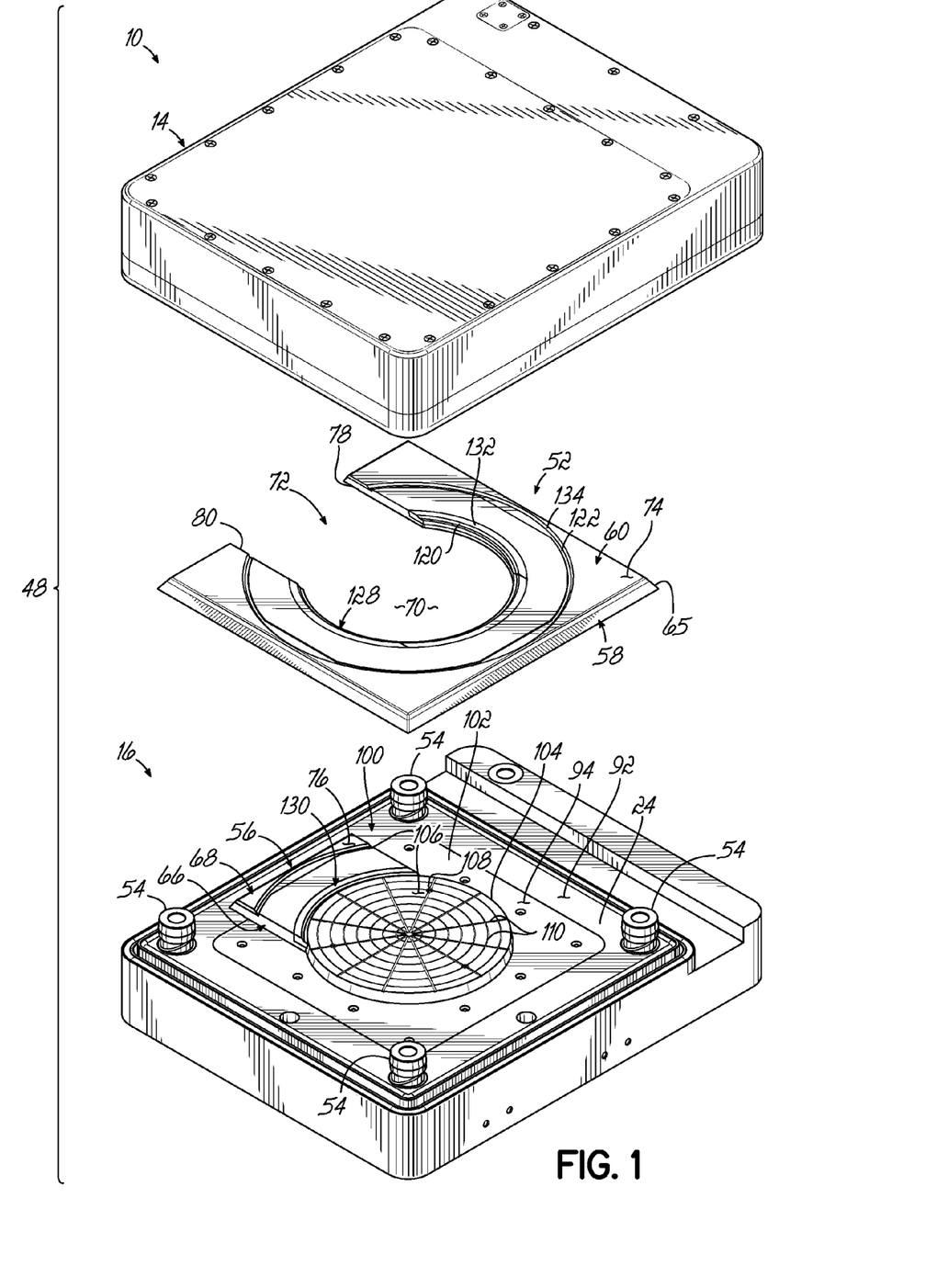
FIG. 1 is an exploded view of a vacuum process chamber for a plasma processing system that includes a wafer lift mechanism in accordance with an embodiment of the invention.

With reference to FIG. 1, a process chamber 10 for use with a plasma processing system generally includes a vacuum vessel or enclosure having a lid 14 and a base 16 upon which the lid 14 rests, a lower electrode 24, an upper electrode (not shown), and a wafer lift mechanism 48 located inside the process chamber 10 that functions to automatically transfer a wafer to and from the lower electrode 24. The lid 14 is mechanically coupled with a lifting device (not shown), which is capable of vertically lifting and lowering the lid 14 relative to the base 16 between raised and lowered positions. When the lid 14 and the base 16 are in a contacting relationship, a processing region is defined as the space bounded vertically between the inwardly-facing horizontal surfaces of the electrodes and bounded laterally inside the inwardly-facing vertical surface of the sidewall defined by the separating ring. When the lid 14 is in the raised position, the processing region is accessible for inserting unprocessed workpieces 28, 30 (FIGS. 6A, 7A) and removing processed workpieces 28, 30. When the lid 14 is in the lowered position, an environment may be established in the processing region that is suitable for plasma processing each successive workpiece 28, 30 positioned in the processing region. The upper electrode moves along with the lid 14 when the lid 14 is moved by the lifting device between the raised and lowered positions relative to the base 16.

During processing of workpieces 28, 30, power applied between the electrodes by a power supply produces an electromagnetic field in the processing region, which is defined between the electrodes when the lid 14 and base 16 are contacting and an environment suitable for plasma processing is present in the processing region. The electromagnetic field excites the atoms or molecules of source gas present in the processing region to a plasma state, which is sustained by the application of power from the power supply for the duration of the plasma treatment.

Constituent species from the plasma contact and interact with exposed material on the workpieces 28, 30 to perform the desired surface modification. The plasma is configured to perform the desired surface modification of the workpiece 28, 30 by selecting parameters such as the chemistry of the source gas, the pressure inside the processing region, and the amount of power and/or frequency applied to the electrodes. The processing system may include an end point recognition system (not shown) that automatically recognizes when a plasma process (e.g., an etching process) has reached a predetermined end point or, alternatively, plasma processes may be timed based upon an empirically-determined time of a process recipe.

With continued reference to FIGS. 1-5, the process chamber 10 includes an assembly 50 that functions as a component of the wafer lift mechanism 48 for transferring workpieces 28, 30 of different outer diameters to and from a pedestal portion 104 of the lower electrode 24. When the one or the other of the workpieces 28, 30 is supported on the lower electrode 24, the assembly 50 circumferentially surrounds the workpiece 28, 30 during processing. Workpiece 28 has top and bottom primary surfaces and an outer peripheral edge 29 that connects the top and bottom primary surfaces. Workpiece 30 has top and bottom primary surfaces and an outer peripheral edge 31 that connects the top and bottom primary surfaces. The outer peripheral edge 31 of workpiece 30 has a larger outer diameter than the outer peripheral edge 29 of workpiece 28. For example, the outer peripheral edge 29 of workpiece 28 may have an outer diameter of 200 millimeters, and the outer peripheral edge 31 of workpiece 30 may have an outer diameter of 300 millimeters.

Further details of a wafer lift mechanism for use with assembly 50 are disclosed in U.S. Publication No. 2009/0311088, which is hereby incorporated by reference herein in its entirety.

The assembly 50 includes a stationary plate 56 that has a fixed position relative to the lower electrode 24 during operation and a lift plate 52. The lift plate 52 constitutes a movable portion of the assembly 50 that moves relative to the stationary plate 56 and the lower electrode 24 when placing one or the other of workpieces 28, 30 on the lower electrode 24 or removing one or the other of the workpieces 28, 30 from the lower electrode 24. Specifically, the lift plate 52 receives one or the other of the workpieces 28, 30 in a raised condition relative to the lower electrode 24 and relative to the stationary plate 56. The lift plate 52 is automatically movable in conjunction with the opening and closing the lid 14 and without operator intervention between a raised position, when the lid 14 is opened, and a lowered position, when the lid 14 is in a closed position relative to the base 16. In other words, the lift plate 52 moves from the raised position toward the lowered position as the upper electrode is moved by the lid 14 toward the lower electrode 24 to seal the processing region and the lift plate 52 moves from the lowered position toward the raised position as the upper electrode is moved by the lid 14 away from the lower electrode 24.

The lift plate 52 of the assembly 50 is mechanically coupled with the lower electrode 24 by a set of resiliently-biased supports 54. A set of resiliently-biased push devices (not shown) project from the upper electrode toward the lower electrode 24 and, as the lid 14 is closed, contact the lift plate 52 to cause the movement relative to the lower electrode 24. When the lid 14 is placed in the lowered position, in which the lid 14 contacts the base 16 to seal the processing region from the ambient environment, the lift plate 52 moves to automatically place one of the workpieces 28, 30 in a treatment position on a pedestal portion 104 of the lower electrode 24. When the lid 14 is lowered, the lift plate 52 and stationary plate 56 each have good electrical contact with the lower electrode 24. As a consequence, the lift plate 52, the stationary plate 56, the workpiece 28, 30 supported on the lower electrode 24, and the lower electrode 24 are at approximately equivalent electrical potentials when the plasma processing system is operating to generate plasma inside the processing region.

The lift plate 52 includes a plurality of members 58, 60, 128 that are joined together. The lift plate 52 includes a central opening 70 extending entirely through the members 58, 60, an outer peripheral edge or perimeter 65, and a gap 72 that extends radially from the central opening 70 to the outer perimeter 65 of the lift plate 52. While the central opening 70 is round in the representative embodiment, the central opening 70 may have other shapes (e.g., rectangular). Member 128 is mounted in a recess 126 adjacent the central opening 70 of member 58.

Figure 2:
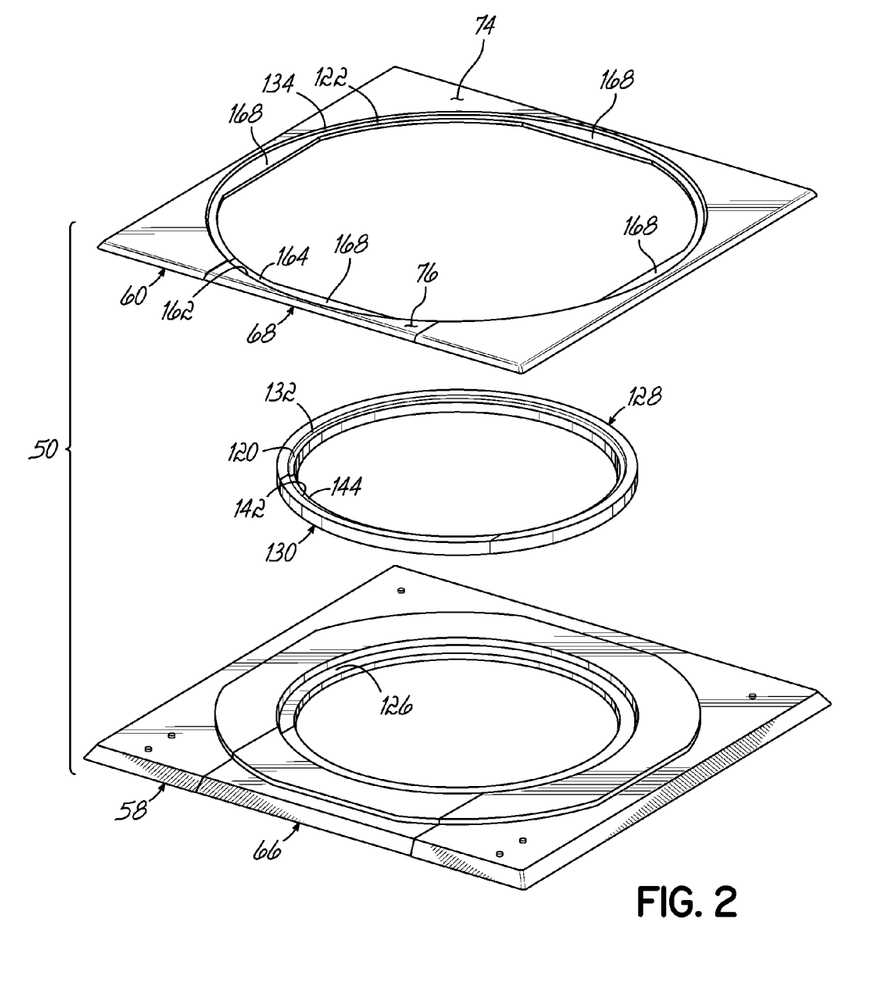
FIG. 2 is a disassembled view of the lift plate and stationary plate of the wafer lift mechanism.
Figure 3:
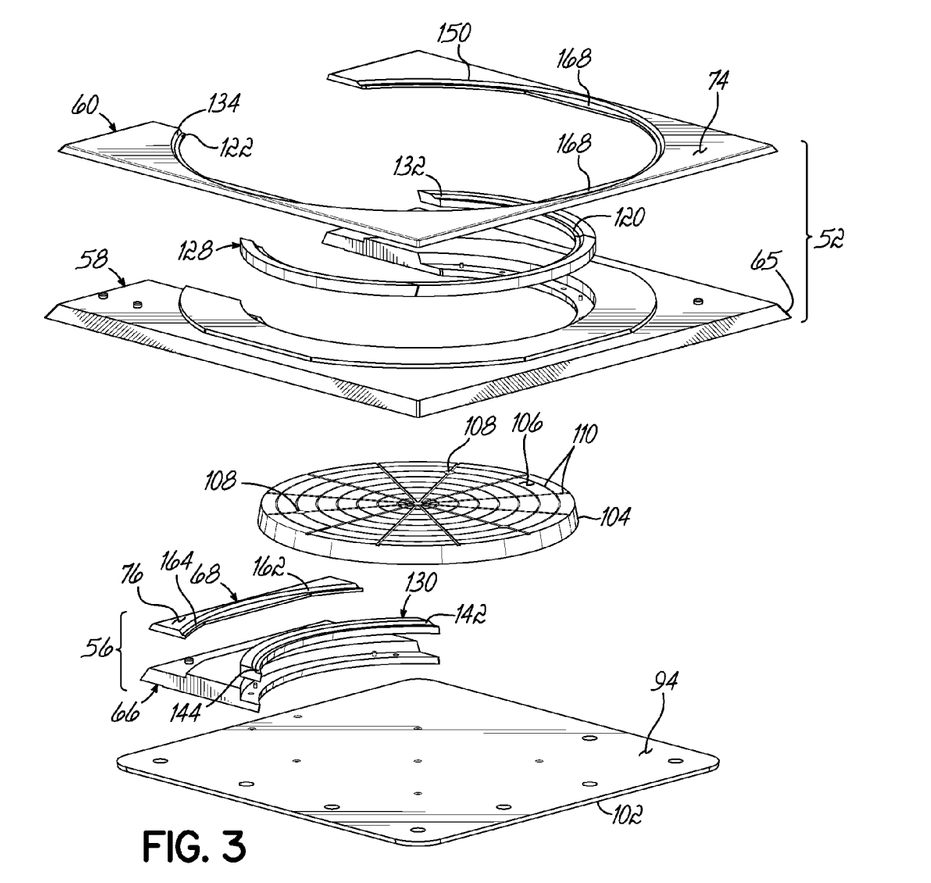
FIG. 3 is an exploded view of the lift plate and stationary plate of the wafer lift mechanism.
Figure 4:
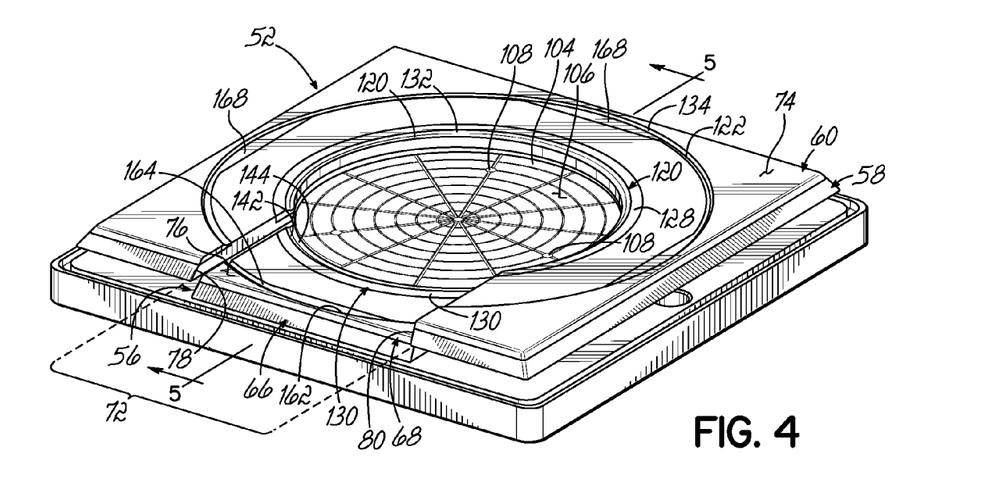
FIG. 4 is a perspective assembled view of the lift plate and stationary plate of the wafer lift mechanism, and a pedestal portion of an electrode of the plasma processing system

The gap 72 is defined between confronting sidewalls 78, 80 extending through the thickness of the lift plate 52. The width of the gap 72 in the lift plate 52 is dimensioned and configured such that an end effector 90 can be manipulated so as to pass through the gap 72 and access the central opening 70 for transferring unprocessed workpieces 28, 30 to the lift plate 52 and removing processed workpieces 28, 30 from the lift plate 52. In this way, the end effector 90 may carry a supported workpieces 28, 30 to transfer the workpieces 28, 30 to a position outside of the process chamber to the assembly 50 inside the process chamber, and vice versa. The end effector 90 is operatively coupled with a robot, such as a selective compliant articulated/assembly robot arm (SCARA) robot, as understood by a person having ordinary skill in the art.

Similar to the lift plate 52, the stationary plate 56 includes a plurality of members 66, 68, 130 that are joined together. The stationary plate 56 is dimensioned with a width slightly less than the width of the gap 72. When the lift plate 52 is lowered to a processing position, the stationary plate 56 fills the gap 72 so that the central opening 70 is surrounded by a substantially planar surface defined collectively by a top surface 74 of the lift plate 52 and a top surface 76 of the stationary plate 56. To promote the requisite coplanar arrangement, the respective thicknesses of the stationary plate 56 and lift plate 52 are selected to be approximately equal, which permits the top surfaces 74, 76 to be approximately flush when the lift plate 52 is in its lowered position.

Figure 5:
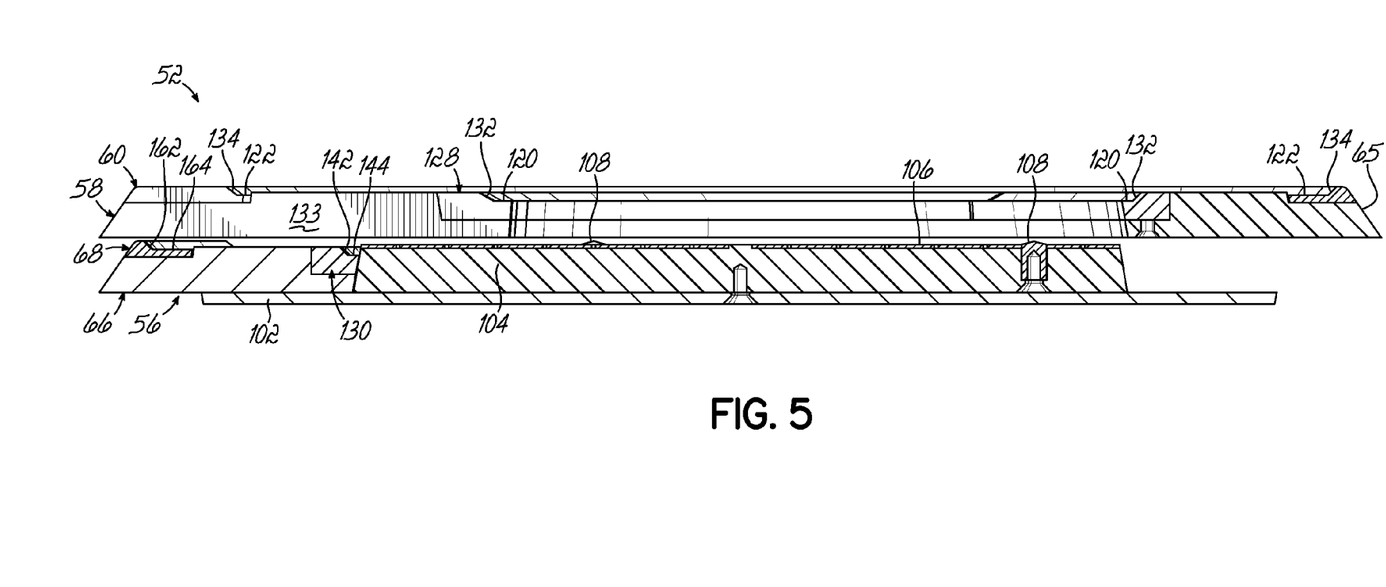
FIG. 5 is a cross-sectional view taken generally along line 5-5 in FIG. 4.

The lower electrode 24 further comprises a removable electrode section 100, which includes a mounting flange 102 situated in a recess defined in the lower electrode 24 and a pedestal portion 104. The pedestal portion 104, which functions as a workpiece support, projects from the mounting flange 102 toward the upper electrode. The electrode section 100 is secured with conventional fasteners to the underlying and surrounding remainder of the lower electrode 24. The electrode section 100 has a good electrical contact with the remainder of the lower electrode 24 so that the pedestal portion 104 is at substantially the same potential as the lower electrode 24 when the plasma processing system is operating and plasma is present in the processing region.

A top surface 92 of lower electrode 24 and a top surface 94 of the mounting flange 102 are approximately flush. The surface area of a top surface 106 of the pedestal portion 104, which is elevated above the surrounding mounting flange 102, is approximately equal to the open cross-sectional area radially inside the central opening 70 of the lift plate 52. The diameter of the pedestal portion 104 is slightly smaller than the diameter of the central opening 70 of the lift plate 52.

The stationary plate 56 projects above the plane of the mounting flange 102. The stationary plate 56 and the pedestal portion 104 may comprise a single or unitary raised region projecting from the mounting flange 102. Alternatively, the stationary plate 56 may comprise a separate component that is mounted to the electrode section 100 and, in this instance, may include locating pins (not shown) or the like used to automatically position the stationary plate 56 relative to the central opening 70 in the lift plate 52. In an embodiment, the top surface 76 of the stationary plate 56 is in a plane slightly lower than a plane of the top surface 106 of the pedestal portion 104.

When the lift plate 52 is lowered toward a processing position as the lid 14 is closed, contact between the one of the workpieces 28, 30 held by the lift plate 52 and the top surface 106 of the pedestal portion 104 transfers the one of the workpieces 28, 30 held by the lift plate 52 from the lift plate 52 to the pedestal portion 104. The workpiece transfer is accomplished without any structure on the pedestal portion 104, the lower electrode 24, or the base 16 of the enclosure 12 guiding the respective workpiece 28, 30 onto the pedestal portion 104. During plasma treatment, the one of the workpieces 28, 30 is supported by bosses 108 positioned on the top surface 106 of the pedestal portion 104. The top surface 106 of the pedestal portion 104 may be a solid plate, or it may have grooves 110 or another non-planar top surface 106 thereof (FIG. 2). Such grooves 110 or non-planar surface help prevent formation of an air pocket under the workpiece and/or sliding of the workpiece relative to the top surface 106 of the pedestal portion 104.

The lift plate 52 includes a rim 120 and a wall 132 that are sized and shaped so as to dimensionally correspond to the outer peripheral edge 29 of the workpiece 28. Rim 120 is curved to define a section of an annulus and has an inner diameter slightly less than an outer diameter of the outer peripheral edge 29 of the workpiece 28. The wall 132 is concave and curved nominally with the same curvature as rim 120 to define a section of an annulus. The wall 132 has an inner diameter slightly greater than an outer diameter of the outer peripheral edge 29 of the workpiece 28. In one embodiment, the inner diameter of the rim 120 may be slightly less than 200 millimeters and the inner diameter of the wall 132 may be greater than 200 millimeters if the workpiece 28 has a nominal outer diameter of 200 mm. The wall 132 projects above the rim 120 so that the outer peripheral edge 29 of the workpiece 28 is capable of being supported on the rim 120 and is radially inside of the wall 132. The wall 132 may have a height approximately equal to the thickness of the workpiece 28.

In the representative embodiment, rim 120 and wall 132 are disposed on member 128, which is separate from member 58. In an alternative embodiment, members 58 and 128 may have an integral construction rather than comprising separate structures.

The lift plate 52 also includes a rim 122 and a wall 134 that are sized and shaped so as to dimensionally correspond to the outer peripheral edge 31 of the workpiece 30. Rim 122 is curved to define a section of an annulus and has an inner diameter slightly less than an outer diameter of the outer peripheral edge 31 of the workpiece 30. The wall 134 is concave and curved nominally with the same curvature as rim 122 to define a section of an annulus. The wall 134 has an inner diameter slightly greater than an outer diameter of the outer peripheral edge 31 of the workpiece 30 and slightly greater than the inner diameter of the rim 122. In one embodiment, the inner diameter of the rim 122 may be slightly less than 300 millimeters and the inner diameter of the wall 134 may be greater than 300 millimeters if the workpiece 30 has a nominal outer diameter of 300 mm. The wall 134 projects above the rim 122 so that the outer peripheral edge 31 of the workpiece 30 is capable of being supported on the rim 122 and is radially inside of the wall 134. The wall 134 may have a height relative to the rim 122 approximately equal to the thickness of the workpiece 30. Rim 122 may have one or more widened regions 168 configured to provide additional support for the workpiece 30 when it is supported on the rim 122.

The rims 120, 122 extend circumferentially about the central opening 70 with rim 120 being coextensive with the central opening 70. The rims 120, 122 are preferably concentric with rim 122 having the larger radius. Similarly, the respective inwardly-facing, concave surfaces of walls 132, 134 extend circumferentially about the central opening 70 and are preferably concentric with rim 122 having the larger radius. In the representative embodiment, the rim 122 and wall 134 are coterminous with the rim 120 and wall 132. The presence of the gap 72 results in the rims 120, 122 and walls 132, 134 having a circumferential discontinuity between sidewalls 78, 80 that is equal in angular extent to the arc length of the gap 72 and that define the sections of the respective annuli. In one embodiment, the rims 120, 122 and walls 132, 134 each have an arc length greater than 180°, preferably greater than 270°. Walls 132, 134 may be tapered to serve as a guide when transferring one or the other of the workpieces 28, 30 from an end effector to the lift plate 52.

The stationary plate 56 includes a wall 142 and a rim 144 that are sized and shaped so as to dimensionally correspond to an outer peripheral edge 29 of the workpiece 28. Rim 144 is curved to define a section of an annulus and has an inner diameter slightly less than an outer diameter of the outer peripheral edge 29 of the workpiece 28. The wall 142 is concave and nominally curved with the same curvature as rim 144 to define a section of an annulus. The wall 142 has an inner diameter slightly greater than an outer diameter of the outer peripheral edge 29 of the workpiece 28. The wall 142 projects above the rim 144 so that, when the lift plate 52 is in the lowered position, the outer peripheral edge 29 of the workpiece 28 overlies the rim 144 and is disposed radially inside of the wall 142. The wall 142 may have a height approximately equal to the thickness of the workpiece 28.

The wall 142 and rim 144 are dimensioned and curved to occupy the gap 72 between the rim 120 and wall 132 of the lift plate 52 when the lift plate 52 is in its lowered position. To that end, the sum of the arc lengths of the walls 132, 142 is equal to $2\pi$ radians (360°) to provide a closed annulus and the sum of the arc lengths of the rims 120, 144 is equal to $2\pi$ radians (360°) to provide a closed annulus. The wall 142 and rim 144 has shorter arc lengths than the wall 132 and rim 120 of the lift plate 52. In one embodiment, the wall 142 and rim 144 each have an arc length less than 180°, preferably less than 90°.

The stationary plate 56 includes a wall 162 and a rim 164 that are sized and shaped so as to dimensionally correspond to an outer peripheral edge 31 of the workpiece 30. Rim 164 is curved to define a section of an annulus and has an inner diameter slightly less than an outer diameter of the outer peripheral edge 31 of the workpiece 30. The wall 162 is concave and curved with the same general curvature as rim 164. The wall 162 has an inner diameter slightly greater than an outer diameter of the outer peripheral edge 31 of the workpiece 30. The wall 162 projects above the rim 164 so that, when the lift plate 52 is in the lowered position, the outer peripheral edge 31 of the workpiece 30 overlies the rim 164 and is disposed radially inside of the wall 162. The wall 162 may have a height approximately equal to the thickness of the workpiece 30.

The wall 162 and rim 164 are dimensioned and curved to occupy the gap 72 between the rim 122 and wall 134 of the lift plate 52 when the lift plate 52 is in its lowered position. To that end, the sum of the arc lengths of the walls 134, 162 is equal to 2π radians (360°) to provide a closed annulus and the sum of the arc lengths of the rims 122, 164 is equal to 2π radians (360°) to provide a closed annulus. The wall 162 and rim 164 has shorter arc lengths than the wall 134 and rim 122 of the lift plate 52. In one embodiment, the wall 162 and rim 164 each have an arc length less than 180°, preferably less than 90°. When the lift plate 52 is in the lowered processing position (FIG. 6C) and in nominally the same plane as the stationary plate 56, the walls 134, 162 have an end-to-end arrangement and the rims 122, 164 have an end-to-end arrangement.

When the lift plate 52 is in the lowered processing position (FIG. 6C) and in nominally the same plane as the stationary plate 56, the end-to-end arrangement of the walls 132, 162 and the end-to-end arrangement of the rims 120, 164 defines a closed annulus or ring of material. Rim 120 of the lift plate 52 may have a radial dimension given by the difference in its inner and outer diameters selected such that only a narrow annular region on the bottom surface of the workpiece 28 is contacted by the rim 120. In one embodiment, the contacted region may be an annulus extending approximately equal to 3 millimeters radially inward from the peripheral edge 29 of workpiece 28.

In the lowered processing position, the rim 120 of the lift plate 52 may be recessed below the top surface 106 of the pedestal portion 104, such that the workpiece 28 is not supported on the 120. Instead, the workpiece 28 may be supported by a plurality of bosses 108 and thereby elevated slightly above the top surface 106 of the pedestal portion 104 of the electrode 24. As such, the rim 120 has a non-contacting relationship with the workpiece 28 when the lift plate 52 is in its lowered position.

Because the lift plate 52 includes rims 120, 122 to accommodate workpieces 28, 30 of two different sizes, the lift plate 52 may be used to process either workpiece 28 or workpiece 30. In other words, once the processing of the workpiece 28 is completed, the same process chamber 10 may be used to process the workpiece 30, and vice versa, without the need to change out or replace any part of the lift plate 52 or stationary plate 56.

Figure 6A:
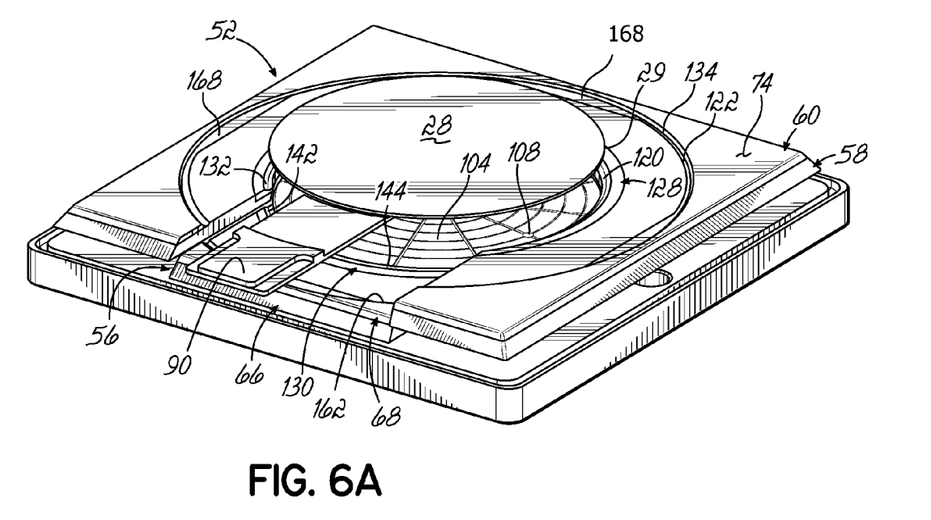
FIG. 6A is a perspective view similar to FIG. 4 in which a wafer of comparatively small diameter is positioned to be placed on the lift plate of the wafer lift mechanism.
Figure 6B:
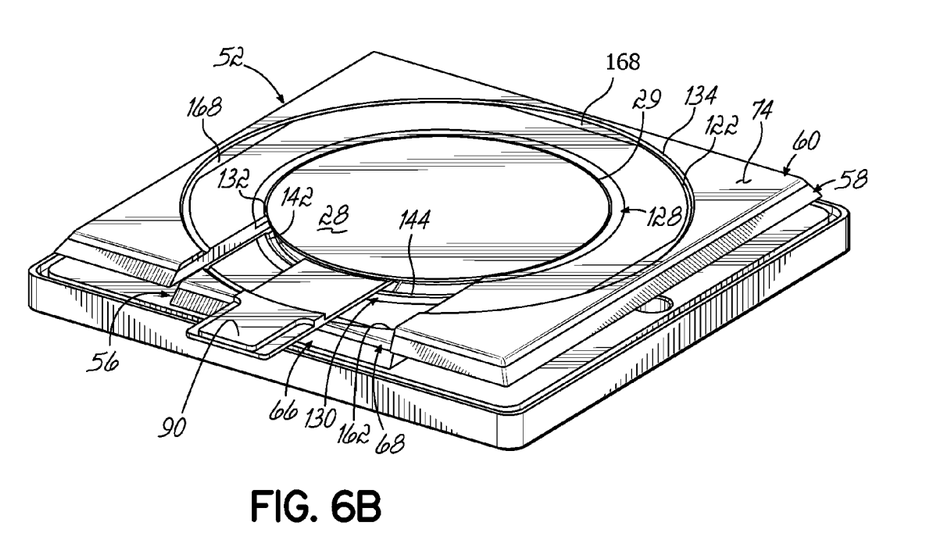
FIG. 6B is a perspective view similar to FIG. 6A in which the wafer is supported by the lift plate of the wafer lift mechanism with the lift plate in a raised condition relative to the pedestal portion of the electrode.
Figure 6C:
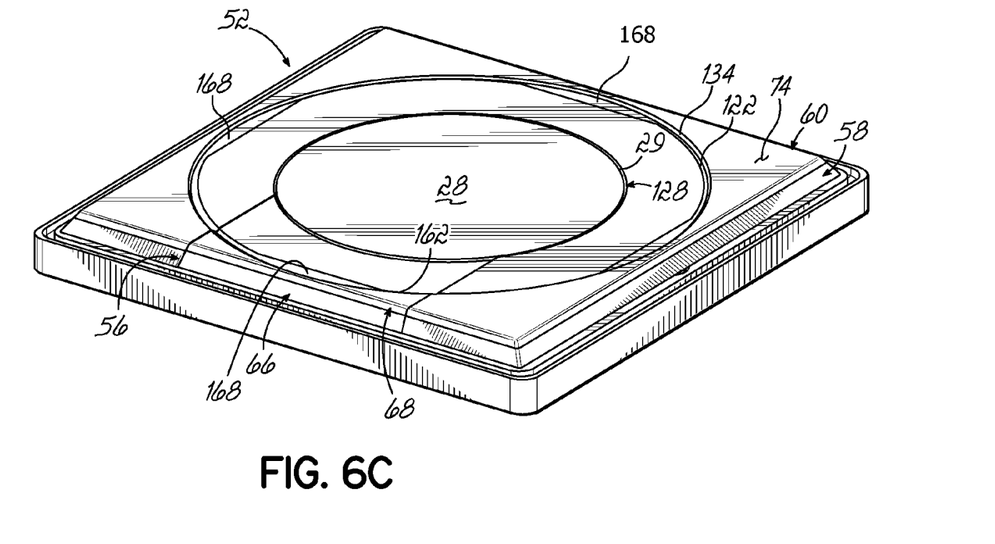
FIG. 6C is a perspective view similar to FIG. 6B in which the wafer is supported the pedestal portion of the electrode after the lift plate is placed in a lowered condition.
Figure 7A:
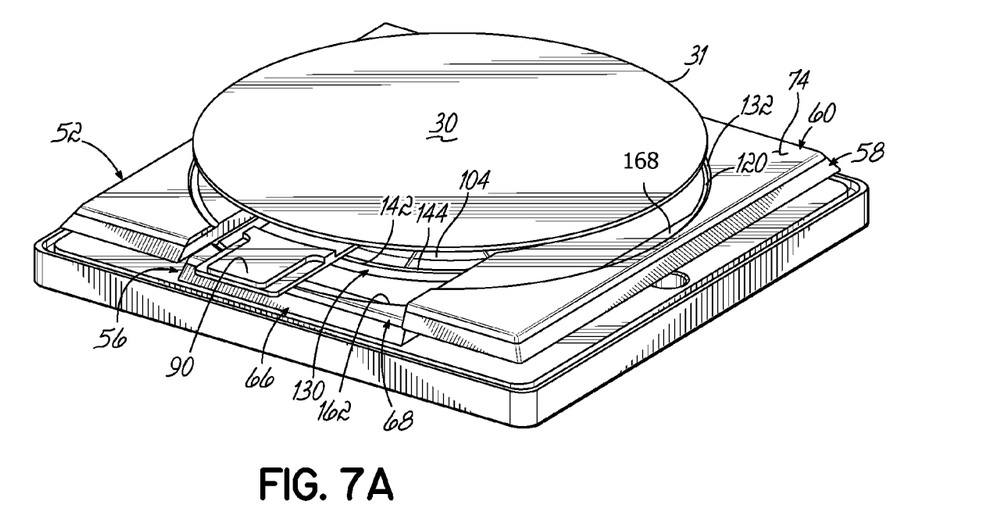
FIG. 7A is a perspective view similar to FIG. 4 in which a wafer of comparatively large diameter is positioned to be placed on the lift plate of the wafer lift mechanism.
Figure 7B:
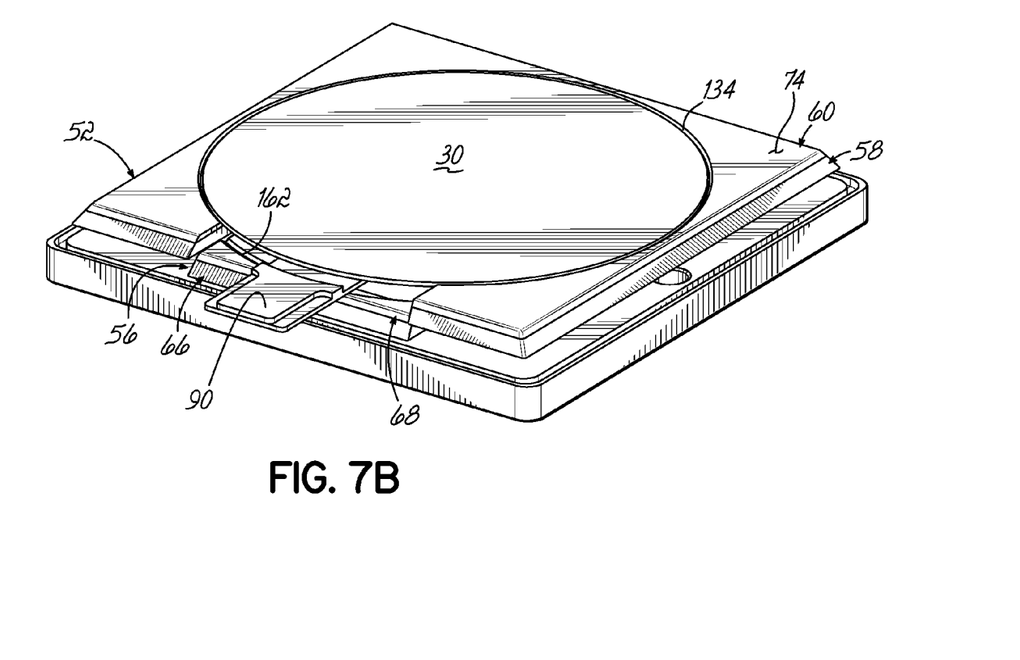
FIG. 7B is a perspective view similar to FIG. 7A in which the wafer is supported by the lift plate of the wafer lift mechanism with the lift plate in a raised condition relative to the pedestal portion of the electrode.
Figure 7C:
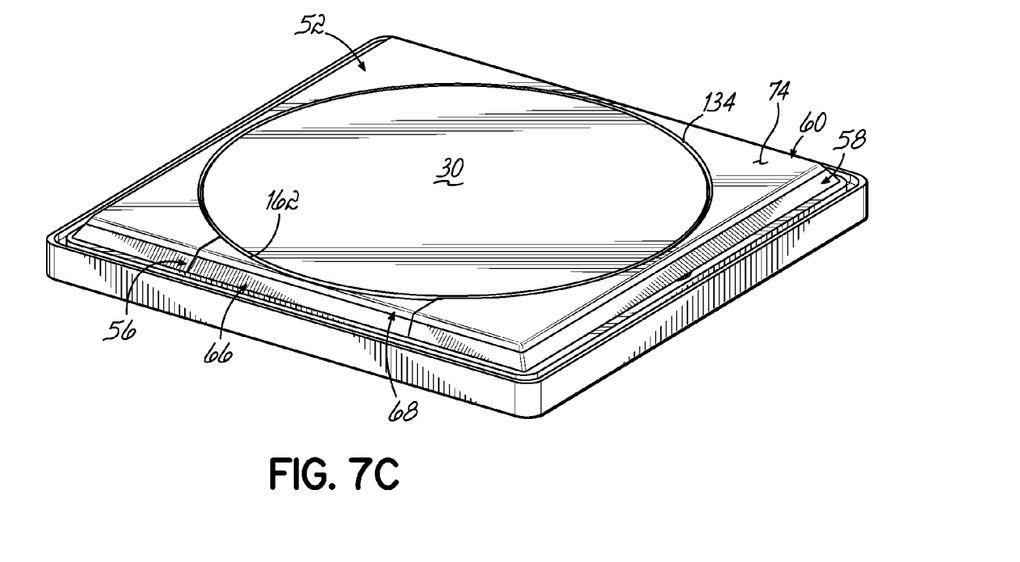
FIG. 7C is a perspective view similar to FIG. 7B in which the wafer is supported the pedestal portion of the electrode after the lift plate is placed in a lowered condition.

In use and with reference to FIGS. 6A-7C, a method of processing the workpieces 28, 30 is described. With the lid 14 of the process chamber 10 raised relative to the base 16, end effector 90 may be used to transfer the workpiece 28 from a position outside of the process chamber 10 to a position inside the plasma process chamber. More specifically, the workpiece 28 may be supported on the end effector 90 at a position outside the process chamber, and then the end effector 90 may be manipulated so as to carry and transfer the supported workpiece 28 to the assembly 50, specifically to the rim 120 on the lift plate 52. As shown in FIG. 6A, the workpiece 28 is placed by the end effector 90 on the rim 120 so that an outer peripheral edge of the workpiece 28 is supported on the rim 120. The end effector 90 is then withdrawn from the process chamber through the gap 72.

As shown in FIG. 6B, once the workpiece 28 is positioned on the lift plate 52, the lift plate 52 moves downward toward the pedestal portion 104 of the lower electrode 24 as the lid 14 of the process chamber 10 is lowered relative to the base 16. Lowering the lid 14 moves the upper electrode toward the lower electrode 24. As shown in FIG. 6C, when the lift plate 52 is substantially lowered, the workpiece 28 is transferred from the rim 120 to the bosses 108 on the pedestal portion 104.

Once the workpiece 28 is positioned on the pedestal portion 104, the process chamber is evacuated using the vacuum pump, and process gas is introduced from the gas inlet plate to establish a suitable sub-atmospheric pressure. The upper electrode and the lower electrode 24 are energized by the power supply to generate a plasma from the process gas in the process chamber. In this way, the workpiece 28 is processed with plasma for a timed exposure or an end-pointed exposure. When the plasma treatment of the workpiece 28 is completed, the process chamber is vented and the lid 14 of enclosure 12 is raised relative to the base 16. As the lift plate 52 moves to the raised position as the lid 14 is raised, the workpiece 28 is contacted by the rim 120 and is lifted from the pedestal portion 104. With the lid 14 opened, the workpiece 28 is again supported in a raised condition by the lift plate 52 (FIG. 6B).

The end effector 90 may again be manipulated to remove the workpiece 28 from the lift plate 52. The separation between the lower electrode 24 and the central opening 70 of the lift plate 52 provides an open space for the end effector 90 to gain access to the backside of the processed workpiece 28, lift the processed workpiece 28 from the central opening 70, and withdraw the processed workpiece 28 from the process chamber 10 of the plasma processing system. The end effector 90 physically fits within the gap 72 during this sequence of motions.

The end effector 90 may be used to serially transfer multiple workpieces 28 to a position on the rim 120 of the lift plate 52. The end effector 90 may also be used to transfer one or more workpieces 30 to a position on the rim 122 of the lift plate 52. The switch to processing workpieces 30 of larger diameter may be accomplished without replacing any part of the lift plate 52 or any part of the stationary plate 56. The same method described above, and with reference to FIGS. 7A-7C, may then be used to process one or more of the workpieces 30.

References herein to terms such as "vertical", "horizontal", etc. are made by way of example, and not by way of limitation, to establish a three-dimensional frame of reference. The term "horizontal" as used herein is defined as a plane substantially parallel to a plane containing the top surface 106 of the pedestal portion 104 of electrode 24, regardless of orientation. The term "vertical" refers to a direction perpendicular to the horizontal, as just defined. Terms, such as "upper", "lower", "on", "above", "below", "side" (as in "sidewall"), "higher", "lower", "over", "beneath" and "under", are defined with respect to the horizontal plane. It is understood various other frames of reference may be employed without departing from the spirit and scope of the invention as a person of ordinary skill will appreciate that the defined frame of reference is relative as opposed to absolute.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept. The scope of the invention itself should only be defined by the appended claims.

What is claimed is:

1. An apparatus for use in the plasma processing of a first workpiece and a second workpiece having different diameters, the apparatus comprising:
   an electrode including a pedestal portion configured to support the first workpiece or the second workpiece; and
   a lift plate having an outer perimeter, an opening inside of said outer perimeter, a first rim surrounding said opening and configured to support the first workpiece, and a second rim surrounding said opening and configured to support the second workpiece, said first rim having an inner diameter, said second rim having an inner diameter that is greater than said inner diameter of said first rim, and said pedestal portion of said electrode fitting within said opening in said lift plate,
   said lift plate is adapted to move relative to said pedestal portion between A) a raised position where either the first workpiece or the second workpiece is in contact with and supported by either the first rim or the second rim, respectively, and B) a lowered position where the pedestal portion is within said opening in said lift plate and either the first workpiece is transferred from said first rim or the second workpiece is transferred from said second rim to said pedestal portion of said electrode, such that either the first workpiece or the second workpiece is not in contact with the first rim or the second rim, respectively.

2. The apparatus of claim 1 wherein said inner diameter of said first rim is approximately equal to an outer diameter of the first workpiece so that said first rim is configured to support the first workpiece near the outer diameter, and said inner diameter of said second rim is approximately equal to an outer diameter of the second workpiece so that said second rim is configured to support the second workpiece near the outer diameter of the second workpiece.

3. The apparatus of claim 1 further comprising:
   a first concave wall positioned radially outward of said first rim and projecting above said first rim; and
   a second concave wall positioned radially outward of said second rim and projecting above said second rim.

4. The apparatus of claim 3 wherein said first concave wall has a height approximately equal to a thickness of the first workpiece, and said second concave wall has a height approximately equal to a thickness of the second workpiece.

5. The apparatus of claim 3 wherein said first rim and said second rim have a concentric arrangement, and said first concave wall and said second concave wall have a concentric arrangement.

6. The apparatus of claim 1 wherein said first rim and said second rim have a concentric arrangement.

7. The apparatus of claim 1 wherein said second rim has one or more widened regions configured to provide additional support for the second workpiece when the second workpiece is supported on said second rim.

8. The apparatus of claim 1 wherein said lift plate includes a gap extending between said opening and said outer perimeter so that said first rim and said second rim are discontinuous, and further comprising:
   a stationary plate sized and positioned so as to fit within said gap, said stationary plate including a third rim with an inner diameter equal to said inner diameter of said second rim and a fourth rim with an inner diameter equal to said inner diameter of said second rim.

9. The apparatus of claim 1 wherein the first rim is coextensive with said opening.

10. The apparatus of claim 1 wherein the pedestal portion of said electrode includes a top surface and a plurality of bosses that project above the top surface, wherein the first workpiece or the second workpiece are configured to contact the plurality of bosses so as to be spaced from the top surface of said pedestal portion when the lift plate is in the lowered position.

* * * * *